United States Patent
Kothari et al.

(10) Patent No.: US 12,341,112 B2
(45) Date of Patent: Jun. 24, 2025

(54) SEMICONDUCTOR DEVICES COMPRISING STEPS

(71) Applicant: Micron Technology, Inc., Boise, ID (US)

(72) Inventors: Rohit Kothari, Boise, ID (US); Adam L. Olson, Boise, ID (US); John D. Hopkins, Meridian, ID (US); Jeslin J. Wu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/442,498

(22) Filed: Feb. 15, 2024

(65) Prior Publication Data

US 2024/0186267 A1 Jun. 6, 2024

Related U.S. Application Data

(60) Continuation of application No. 17/447,618, filed on Sep. 14, 2021, now Pat. No. 11,916,024, which is a (Continued)

(51) Int. Cl.
*H01L 23/00* (2006.01)
*H01L 21/3105* (2006.01)
(Continued)

(52) U.S. Cl.
CPC ...... *H01L 23/562* (2013.01); *H01L 21/31053* (2013.01); *H01L 21/31144* (2013.01); *H01L 21/76224* (2013.01)

(58) Field of Classification Search
CPC ............ H01L 23/562; H01L 21/31053; H01L 21/31144; H01L 21/76224;
(Continued)

(56) References Cited

U.S. PATENT DOCUMENTS

| | | |
|---|---|---|
| 6,174,814 B1 | 1/2001 | Cook et al. |
| 8,592,939 B2 | 11/2013 | Nakazawa |

(Continued)

FOREIGN PATENT DOCUMENTS

| | | |
|---|---|---|
| CN | 107342289 A | 11/2017 |
| CN | 107863290 A | 3/2018 |

(Continued)

OTHER PUBLICATIONS

Chinese First Office Action for Chinese Application No. 201911309893.7, dated Mar. 10, 2023, 19 pages with translation.
(Continued)

*Primary Examiner* — Jonathan Han
(74) *Attorney, Agent, or Firm* — TraskBritt

(57) ABSTRACT

A method of forming a semiconductor device comprising forming a patterned resist over a stack comprising at least one material and removing a portion of the stack exposed through the patterned resist to form a stack opening. A portion of the patterned resist is laterally removed to form a trimmed resist and an additional portion of the stack exposed through the trimmed resist is removed to form steps in sidewalls of the stack. A dielectric material is formed between the sidewalls of the stack to substantially completely fill the stack opening, and the dielectric material is planarized. Additional methods are disclosed, as well as semiconductor devices.

20 Claims, 10 Drawing Sheets

Related U.S. Application Data division of application No. 16/235,665, filed on Dec. 28, 2018, now Pat. No. 11,127,691.

(51) Int. Cl.
  *H01L 21/311* (2006.01)
  *H01L 21/762* (2006.01)

(58) Field of Classification Search
  CPC ............ H01L 21/76232; H01L 23/544; H01L 23/564; H01L 2223/54426; H10B 41/00; H10B 41/20; H10B 43/00; H10B 43/20; H10B 41/50; H10B 41/27
  See application file for complete search history.

(56) References Cited

U.S. PATENT DOCUMENTS

| | | | |
|---|---|---|---|
| 9,449,987 B1 | 9/2016 | Miyata et al. | |
| 9,589,912 B1 | 3/2017 | Liang et al. | |
| 9,673,213 B1 | 6/2017 | Yu et al. | |
| 2011/0169071 A1 | 7/2011 | Uenaka et al. | |
| 2013/0161821 A1* | 6/2013 | Hwang | H10B 43/27 257/E21.585 |
| 2015/0279852 A1* | 10/2015 | Mizutani | H10B 41/27 257/315 |
| 2017/0250194 A1 | 8/2017 | Lee et al. | |
| 2018/0174890 A1 | 6/2018 | Mathew et al. | |
| 2018/0366481 A1 | 12/2018 | Kothari et al. | |

FOREIGN PATENT DOCUMENTS

| | | |
|---|---|---|
| CN | 108886039 A | 11/2018 |
| TW | 201428843 A | 7/2014 |

OTHER PUBLICATIONS

Chinese Second Office Action for Chinese Application No. 201911309893.7, dated Oct. 11, 2023, 13 pages with translation.

* cited by examiner

SEMICONDUCTOR DEVICES COMPRISING STEPS

CROSS-REFERENCE TO RELATED APPLICATIONS

This application is a continuation of U.S. patent application Ser. No. 17/447,618, filed Sep. 14, 2021, now U.S. Pat. No. 11,916,024, issued Feb. 27, 2024, which is a divisional of U.S. patent application Ser. No. 16/235,665, filed Dec. 28, 2018, now U.S. Pat. No. 11,127,691, issued Sep. 21, 2021, the disclosure of each of which is hereby incorporated herein in its entirety by this reference.

TECHNICAL FIELD

Embodiments disclosed herein relate to semiconductor fabrication including methods of forming semiconductor devices having large openings therein. More particularly, embodiments of the disclosure relate to methods of forming semiconductor devices comprising large openings and at least one step to reduce cracking or delamination and to semiconductor devices comprising the at least one step.

BACKGROUND

A continuing goal of the semiconductor industry has been to increase the memory density (e.g., the number of memory cells per memory die) of memory devices, such as non-volatile memory devices (e.g., NAND Flash memory devices). One way of increasing memory density in non-volatile memory devices is to implement vertical memory array (also referred to as a "three-dimensional (3D) memory array") architectures. A conventional vertical memory array includes transistor/memory-cell pillars extending through repeating conducting/insulating materials (e.g., tiers), where the conducting materials function as control gates. The vertically stacked tiers of conductive materials are configured, for example, as word lines or control gates and the insulating materials are at each junction of the memory-cell pillars and the conductive materials. Such a configuration permits a greater number of transistors to be located in a unit of die area by building the array upwards (e.g., longitudinally, vertically) on a die, as compared to structures with conventional planar (e.g., two-dimensional) arrangements of transistors.

During the fabrication of conventional vertical memory arrays, an opening (e.g., slit, slot) is formed in tiers 105 of alternating conductive materials 110 and insulating materials 115, as shown in FIG. 1. The opening has relatively large dimensions compared to openings formed, for example, for contacts. A fill material 120 is formed in the opening and subsequently subjected to thermal treatment for densification and abrasive planarization (e.g., chemical mechanical planarization) to planarize a top surface of the fill material 120 before additional components of the vertical memory array are formed. In other words, the top surface of the fill material 120 is substantially planar with the top surface of the tiers 105. Since the opening has large dimensions, a large volume of the fill material is used to fill the opening. During the thermal treatment and abrasive planarization, the fill material 120 is subjected to stress and shrinks away from sidewalls of the tiers 105, causing cracking and delamination of the fill material 120. As shown in FIG. 1, a crack 125 forms along sidewalls of the fill material 120 and propagates to the bottom of the tiers 105. As the number of tiers 105 in the vertical memory array increases, cracking and delamination of the fill material becomes more problematic.

DETAILED DESCRIPTION

Figure 1:
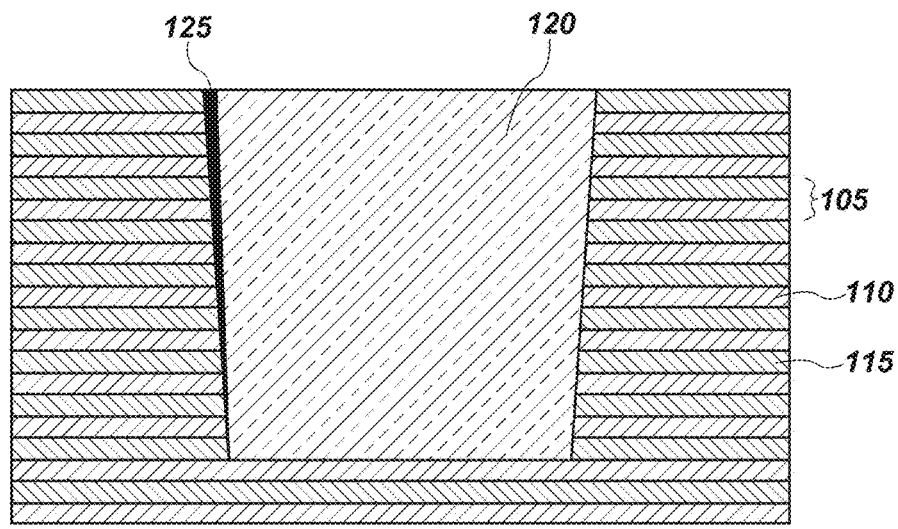
FIG. 1 is a cross-sectional view showing a semiconductor structure comprising a crack in a fill material according to a conventional process.

Methods of reducing or substantially eliminating cracking or delamination of a fill material in a semiconductor structure are disclosed. The fill material may be formed in a stack opening (e.g., slit, slot) having large dimensions such that a large volume of the fill material is used. The stack opening is defined by sidewalls of one or more materials of a stack, where the sidewalls of the stack exhibit a stepped profile (i.e., having one or more steps) along a portion of the stack sidewalls. The one or more steps in the stack prevent cracks from forming in the fill material following the application of stress to the fill material, or prevent cracks from propagating through the fill material following the application of stress to the fill material. The stress may be applied, for example, by subjecting the fill material to an abrasive planarization (e.g., chemical mechanical planarization (CMP)) act. The stepped profile in the sidewalls of the stack is formed by a so-called "trim-etch-trim" process and does not substantially increase the cost or number of process acts conducted to form the semiconductor structure includes the one or more steps. Semiconductor devices including the semiconductor structures according to embodiments of the disclosure are also disclosed.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor structure or a semiconductor device including the semiconductor structure or a complete process flow for manufacturing the semiconductor structure or the semiconductor device including the semiconductor structure. Only those process acts and structures necessary to understand the embodiments described herein are described in detail below. Additional acts to form a complete semiconductor structure or a complete semiconductor device may be performed by conventional techniques.

The materials described herein may be formed by conventional techniques including, but not limited to, spin coating, blanket coating, chemical vapor deposition (CVD), atomic layer deposition (ALD), plasma enhanced ALD, or physical vapor deposition (PVD). Alternatively, the materials may be grown in situ. Depending on the specific material to be formed, the technique for forming (e.g., depositing) or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, the singular forms "a," "an," and "the" are intended to include the plural forms as well, unless the context clearly indicates otherwise.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "and/or" includes any and all combinations of one or more of the associated listed items.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the term "configured" refers to a size, shape, material composition, and arrangement of one or more of at least one structure and at least one apparatus facilitating operation of one or more of the structure and the apparatus in a pre-determined way.

As used herein, the terms "large" and "small" may be used for ease of description to describe one element's or feature's size relative to another element(s) or feature(s) as illustrated in the figures. The terms do not necessarily refer to specific dimensions of the element(s) or feature(s).

As used herein, the term "selectively etchable" means and includes a material that exhibits a greater etch rate responsive to exposure to a given etch chemistry relative to another material exposed to the same etch chemistry. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

As used herein, the term "semiconductor device" includes without limitation a memory device, as well as other semiconductor devices which may or may not incorporate memory, such as a logic device, a processor device, or a radiofrequency (RF) device. Further, a semiconductor device may incorporate memory in addition to other functions such as, for example, a so-called "system on a chip" (SoC) including a processor and memory, or a semiconductor device including logic and memory.

As used herein, the term "stack opening" means and includes an opening in a stack of one or more materials, the opening comprising a depth of from about 0.5 µm to about 100 µm, a width of from about 1 µm to about 10 µm, and a length of from about 1 µm to about 10 µm.

As used herein, the term "step" means and includes a structure including a riser portion and a tread portion in a material. The riser portion extends in a direction substantially perpendicular or sloped relative to a direction of the tread portion. The step is defined by the riser portion and the tread portion and is only present in a portion of the material. In other words, the material does not include steps extending an entire distance from a top surface of the material to a bottom surface of the material. Since the steps do not extend the entire distance, a semiconductor structure or a semiconductor device including the step or steps according to embodiments of the disclosure is distinguished from steps of a staircase structure in which the steps are positioned along substantially an entire length thereof.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein, the term "substrate" means and includes a base material or construction upon which additional materials are formed. The substrate may be a semiconductor substrate, a base semiconductor layer on a supporting structure, a metal electrode, or a semiconductor substrate having one or more materials, layers, structures, or regions formed thereon. The materials on the semiconductor substrate may include, but are not limited to, semiconductive materials, insulating materials, conductive materials, etc. The substrate may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

As used herein with reference to the stepped profile of the stack, the term "tread width" means and refers to a horizontal dimension of an individual step as measured in a direction toward a sidewall of the stack, and the term "riser height" means and refers to a substantially vertical or sloped dimension of an individual step as measured in a direction substantially perpendicular or sloped relative to the tread width.

As used herein, the terms "vertical," "longitudinal," "horizontal," are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

Figure 2:
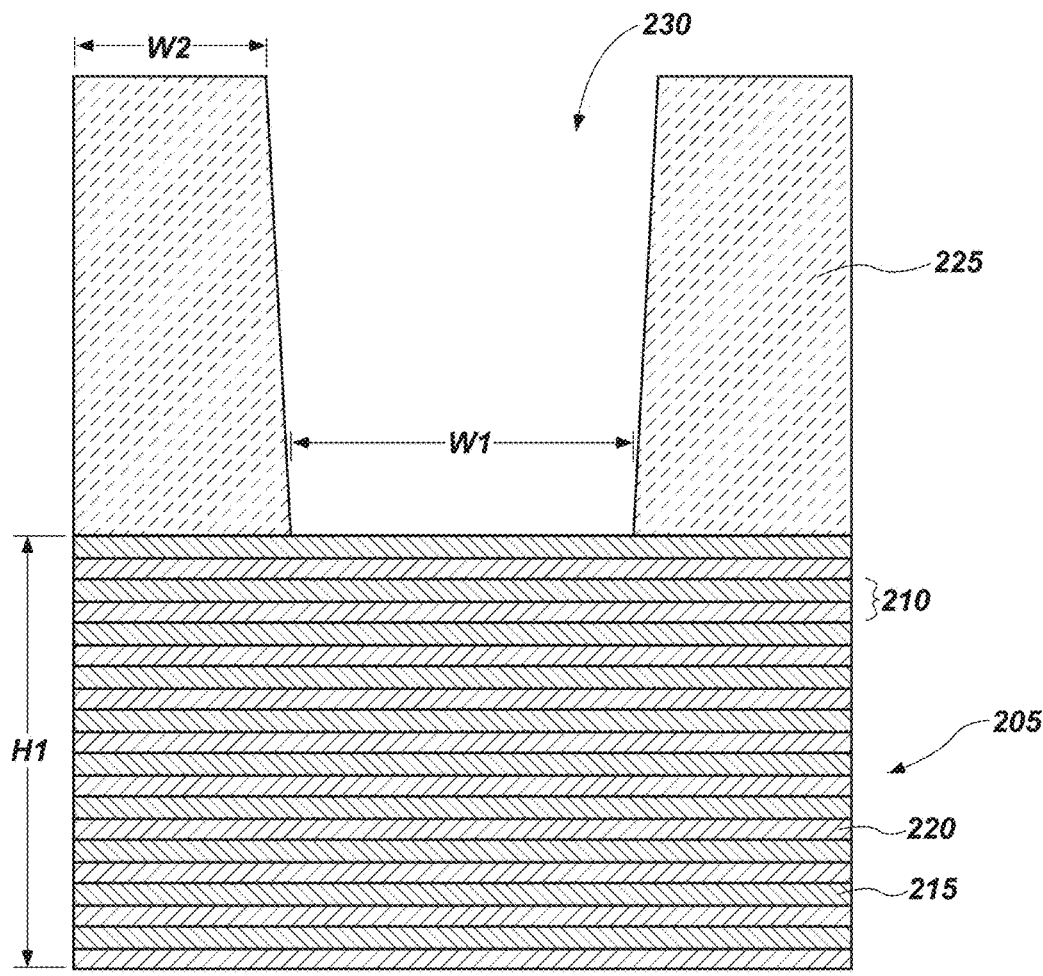
FIGS. 2-5, 6A, and 6B are cross-sectional views showing the fabrication of a semiconductor structure in accordance with embodiments of the disclosure.

To form the stepped profile, a patterned resist 225 is formed over a stack 205 of one or more materials on a substrate (not shown), as shown in FIG. 2. The stack 205 may include the one or more materials in which a stack opening and a fill material are subsequently formed. While FIG. 2 illustrates the stack 205 as including tiers 210 of a first material 215 and a second material 220, the stack 205 may include a single material or multiple materials in configurations other than the tiers 210. The one or more materials of the stack 205 may include one or more conductive materials, one or more dielectric materials, or a combination thereof, such as alternating conductive materials and dielectric materials or alternating different dielectric materials. The alternating materials of the tiers 210 may be selectively etchable relative to one another. In some embodiments, the stack 205 includes tiers 210 of alternating conductive materials and dielectric materials. In other embodiments, the stack 205 includes tiers 210 of alternating first dielectric materials and second dielectric materials. A height H1 of the stack 205 may range from about 0.5 μm to about 150 μm, such as from about 2 μm to about 100 μm. If the stack 205 includes the tiers 210 of alternating materials, the number of tiers 210 may range between 35 tiers and 1000 tiers. By way of example only, the stack 205 may include greater than or equal to 55 tiers, greater than or equal to 60 tiers, greater than or equal to 65 tiers, greater than or equal to 70 tiers, greater than or equal to 75 tiers, greater than or equal to 80 tiers, greater than or equal to 85 tiers, greater than or equal to 90 tiers, greater than or equal to 95 tiers, or greater than or equal to 100 tiers may be present.

The conductive material of the tiers 210 may include, but is not limited to, a metal (e.g., tungsten, titanium, molybdenum, niobium, vanadium, hafnium, tantalum, chromium, zirconium, iron, ruthenium, osmium, cobalt, rhodium, iridium, nickel, palladium, platinum, copper, silver, gold, aluminum), a metal alloy (e.g., a cobalt-based alloy, an iron-based alloy, a nickel-based alloy, an iron- and nickel-based alloy, a cobalt- and nickel-based alloy, an iron- and cobalt-based alloy, a cobalt- and nickel- and iron-based alloy, an aluminum-based alloy, a copper-based alloy, a magnesium-based alloy, a titanium-based alloy, a steel, a low-carbon steel, a stainless steel), a conductive metal-containing material (e.g., a conductive metal nitride, a conductive metal silicide, a conductive metal carbide, a conductive metal oxide), polysilicon, a conductively-doped semiconductor material (e.g., conductively-doped silicon, conductively-doped germanium, conductively-doped silicon germanium), or a combination thereof. In some embodiments, the conductive material is polysilicon. The thickness of each of the conductive materials may range from about 1 nm to about 1000 nm, such as from about 1 nm to about 500 nm, from about 10 nm to about 500 nm, or from about 10 nm to about 250 nm. In some embodiments, the thickness of the conductive material ranges from about 10 nm to about 100 nm.

The dielectric material may include, but is not limited to, an oxide material (e.g., silicon dioxide, tetraethylorthosilicate, phosphosilicate glass, borosilicate glass, borophosphosilicate glass, fluorosilicate glass, titanium dioxide, zirconium dioxide, hafnium dioxide, tantalum oxide, magnesium oxide, aluminum oxide, or a combination thereof), a nitride material (e.g., silicon nitride), an oxynitride material (e.g., silicon oxynitride), amorphous carbon, or a combination thereof. If alternating dielectric materials are present in the tiers 210, a first dielectric material and a second dielectric material may be one of the previously mentioned materials, where the two dielectric materials are selected to be selectively etchable relative to one another. In some embodiments, the dielectric material is a silicon oxide, such as silicon dioxide, or silicon nitride. The thickness of each of the dielectric materials may range from about 1 nm to about 1000 nm, such as from about 1 nm to about 500 nm, from about 10 nm to about 500 nm, or from about 10 nm to about 250 nm. In some embodiments, the thickness of the dielectric material ranges from about 10 nm to about 100 nm.

In some embodiments, the tiers 210 include polysilicon as the conductive material and silicon dioxide as the dielectric material. In other embodiments, the tiers 210 include silicon dioxide as the first dielectric material and silicon nitride as the second dielectric material.

A resist is formed over the stack 205 at a thickness sufficient to conduct subsequent process acts, such as repeated trim and etch acts. The resist may be a photoresist, such as a conventional 193 nm resist, a conventional 248 nm resist, a conventional 365 nm resist, or a conventional deep ultraviolet (DUV) resist. The photoresist may exhibit a positive tone or a negative tone. However, the resist may include other polymeric materials. The resist is patterned to form the patterned resist 225 over the stack 205 and the patterned resist 225 is used as a mask to remove exposed portions of the stack 205. The resist may be patterned, for example, by photolithography, nanoimprint lithography, e-beam writing, etc., or other lithography technique. The patterned resist 225 includes an opening 230 that extends through the thickness of the resist and exposes the underlying stack 205. The opening 230 is defined by sidewalls of the patterned resist 225. The opening 230 is formed by conventional lithography techniques, which are not described in detail herein. Dimensions of the opening 230 are determined by desired dimensions of a stack opening (see FIG. 3) to be formed in the stack 205. The opening 230 is formed at a width W1 and the patterned resist 225 is formed at a width W2. The width W1 of the opening 230 may be from about 1 µm to about 10 µm, such as from about 2 µm to about 10 µm, from about 3 µm to about 10 µm, from about 4 µm to about 10 µm, from about 5 µm to about 10 µm, from about 6 µm to about 10 µm, from about 7 µm to about 10 µm, from about 8 µm to about 10 µm, or from about 9 µm to about 10 µm. However, the width W1 of the opening 230 may be substantially larger, such as from about 10 µm to about 1000 µm (1 mm), or may be substantially smaller, such as from about 100 nm to about 500 nm. In some embodiments, the width of the opening 230 is about 4 µm. In some embodiments, the width of the opening 230 is about 5 µm. While FIG. 2 illustrates the sidewalls of the patterned resist 225 as being slightly sloped, the sidewalls may be substantially vertical or may be more sloped depending on the resist and the etch conditions used to form the opening 230. If the sidewalls are sloped, the widths W1 and W2 are understood to be average widths. A length (not shown in the perspective of FIG. 2) of the opening 230 may be within the range for the width mentioned above.

Figure 3:
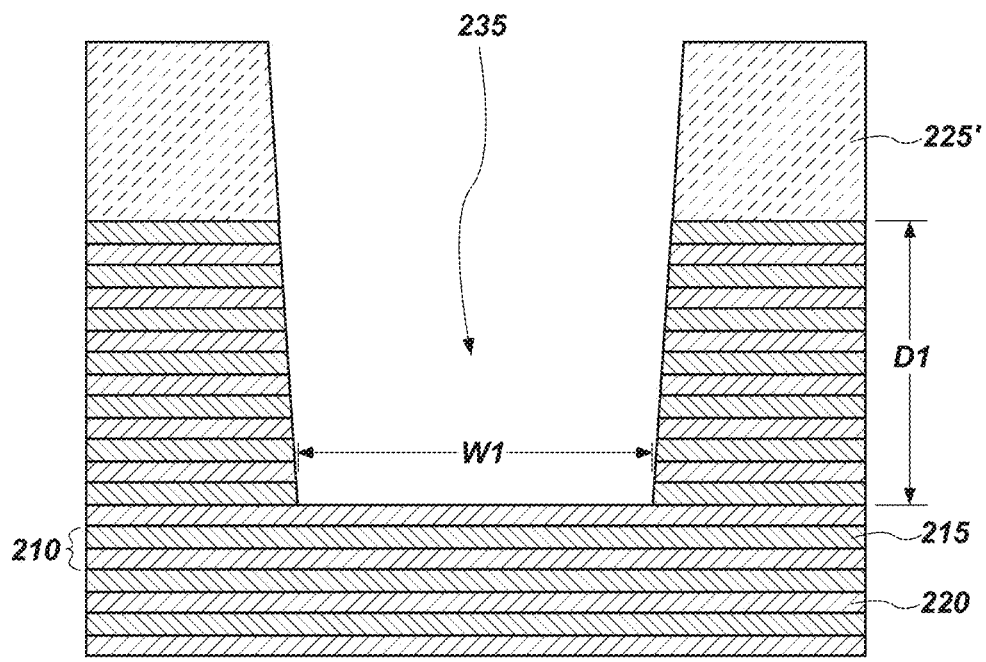

The patterned resist 225 is used as a mask to remove (e.g., etch) a portion of the tiers 210 exposed through the opening 230, as shown in FIG. 3. The opening 230 in the patterned resist 225 is, therefore, extended into the tiers 210 to form stack opening 235. The stack opening 235 has a depth D1 and the width W1 and is defined by sidewalls and a bottom surface of the materials of the tiers 210. While FIG. 3 illustrates the sidewalls of the tiers 210 as being slightly sloped, the sidewalls may be substantially vertical or may be more sloped. If the sidewalls are sloped, the width W1 is understood to be an average width. The stack opening 235 extends into the tiers 210 but does not completely extend through the tiers 210. In other words, the depth D1 of the stack opening 235 is less than the height H1 of the stack 205. The depth D1 of the stack opening 235 is measured from a top surface (e.g., an uppermost surface) of the tiers 210 to the bottom surface of the materials of the tiers 210. The depth D1 of the stack opening 235 may be from about 0.5 µm to about 100 µm, such as from about 1 µm to about 10 µm, such as from about 2 µm to about 10 µm, from about 3 µm to about 10 µm, from about 4 µm to about 10 µm, from about 5 µm to about 10 µm, from about 6 µm to about 10 µm, from about 7 µm to about 10 µm, from about 8 µm to about 10 µm, or from about 9 µm to about 10 µm, from about 10 µm to about 100 µm, from about 20 µm to about 100 µm, from about 30 µm to about 100 µm, from about 40 µm to about 100 µm, from about 50 µm to about 100 µm, from about 60 µm to about 100 µm, from about 70 µm to about 100 µm, from about 80 µm to about 100 µm, or from about 90 µm to about 100 µm. In some embodiments, the depth D1 of the stack opening 235 is about 2 µm. In some embodiments, the depth D1 of the stack opening 235 is about 3 µm.

The width W1 of the stack opening 235 may be substantially the same as the width W1 of the opening 230, such as from about 1 µm to about 10 µm, from about 2 µm to about 10 µm, from about 3 µm to about 10 µm, from about 4 µm to about 10 µm, from about 5 µm to about 10 µm, from about 6 µm to about 10 µm, from about 7 µm to about 10 µm, from about 8 µm to about 10 µm, or from about 9 µm to about 10 µm. However, the width W1 of the stack opening 235 may be substantially larger, such as from about 10 µm to about 1000 µm (1 mm). The dimensions of the stack opening 235 may also be lower than the above range, such as if the fill material 250 to be formed in the stack opening 235 is prone to cracking. For instance, the stack opening 235 may be formed at a width of less than about 500 nm, less than about 400 nm, less than about 300 nm, less than about 200 nm, or less than about 150 nm if the fill material 250 to be formed in the stack opening 235 is prone to cracking. By way of example only, the stack opening 235 may be formed at a width W1 of from about 100 nm to about 500 nm if the fill material 250 to be used is prone to cracking. In some embodiments, the width of the stack opening 235 is about 4 µm. In other embodiments, the width of the stack opening 235 is about 5 µm. A length (not shown in the perspective of FIG. 3) of the stack opening 235 may be within the ranges mentioned above.

The exposed portions of the tiers 210 may be selectively removed using a conventional etchant and conventional etch conditions, which are not described in detail herein. The etchant may be selected based on the materials of the tiers 210. By way of example only, the tiers 210 may be exposed to an isotropic etch to form the stack opening 235. The depth D1 of the stack opening 235 may be tailored by appropriately selecting the etchant and the etch conditions, such as by increasing or decreasing the etch time, etch temperature, etc. As the exposed portions of the tiers 210 are removed, a portion of the patterned resist 225 may also be removed, reducing the thickness of the patterned resist 225 and forming patterned resist 225'.

The stack opening 235 in the stack 205 is not limited to any specific purpose. Rather, the stack opening 235 may be used for a variety of purposes, such as to form overlay (e.g., alignment or registration) marks therein, to obtain optical information from structures underneath, to provide electrical connection, to provide access to underlying materials, etc. The dimensions of the stack opening 235 may be determined by the intended purpose of the stack opening 235 in the semiconductor device ultimately to be formed. The stack opening 235 may also be referred to herein as a slit or a slot. The stack opening 235 may, for example, exhibit a polygon shape, a cylindrical shape, a trapezoidal shape, etc.

Figure 4:
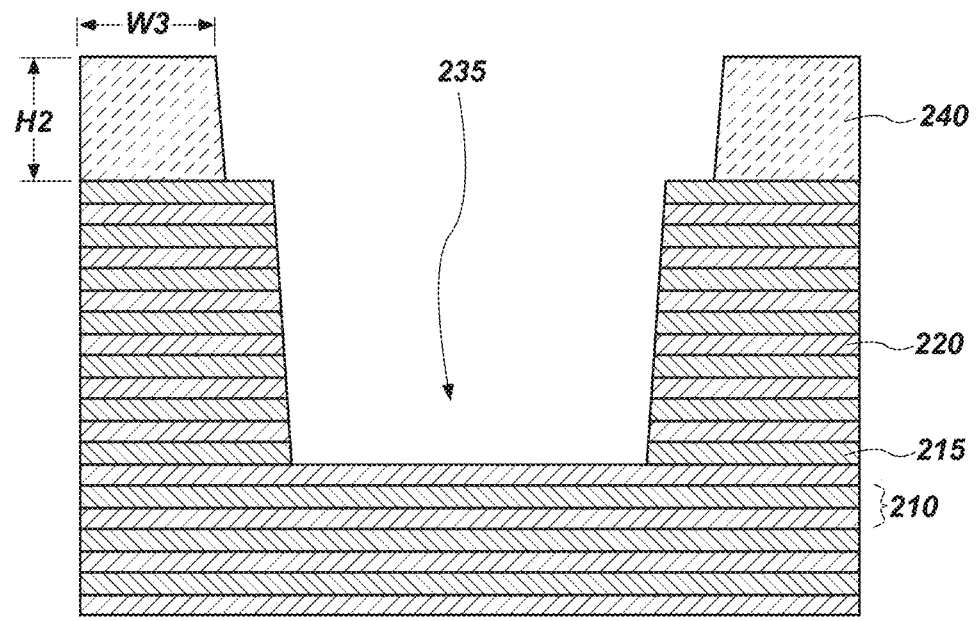

As shown in FIG. 4, a portion of the patterned resist 225' is removed (e.g., etched) from horizontal surfaces and vertical surfaces to form a trimmed resist 240 having a height H2 that is less than the initial thickness of the patterned resist 225 or the height of the patterned resist 225'. The trimmed resist 240 also exhibits a width W3 that is less than the width W2. If the sidewalls are sloped, the width W3 is understood to be an average width. The portion of the patterned resist 225' may be removed in the horizontal and vertical directions using a conventional etchant and conventional etch conditions, which are not described in detail herein. The etchant may selectively remove the desired portion of the patterned resist 225' without substantially removing the materials of the tiers 210. By way of example only, the patterned resist 225' may be subjected to an isotropic etch to form the trimmed resist 240. Dimensions of the trimmed resist 240 may be determined depending on the size of a step to be formed in the tiers 210.

Figure 5:
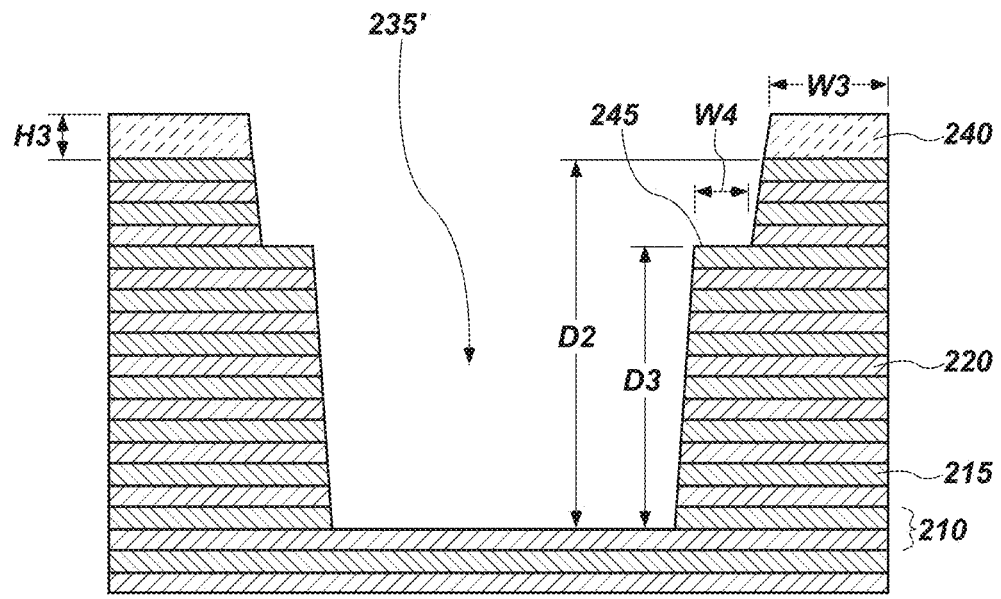

The trimmed resist 240 is used as a mask to remove (e.g., etch) an exposed portion of the tiers 210, forming steps 245 in the sidewalls of the tiers 210 and reducing the trimmed resist 240 to height H3, as shown in FIG. 5. In other words, a pattern of the trimmed resist 240 is translated down into a portion of the underlying tiers 210 depending on a desired location of the steps 245. The steps 245 are, therefore, formed by a so-called "trim-etch-trim" process. The steps 245 are defined by the riser portion and the tread portion of the sidewalls of the tiers 210. The steps 245 have a riser height D3 substantially equivalent to a height of the tiers 210 positioned below the step 245 and a tread width W4 substantially equivalent to the width of resist removed when forming the trimmed resist 240. While FIG. 5 illustrates the sidewalls of the tiers 210 as being slightly sloped, the sidewalls may be substantially vertical or may be more sloped. The tread portion of the steps 245 may extend in a substantially horizontal direction while the riser portion(s) are substantially vertical or sloped relative to the tread portion. A relative size of the steps 245 and a location of the steps 245 may be tailored, as described in more detail below. As shown in FIG. 5, the steps 245 are formed in both materials of the alternating materials of the tiers 210, and not only in one material of the tiers 210. The steps 245 may have a riser height of from about 10 nm to about 1000 nm, such as from about 10 nm to about 500 nm, from about 10 nm to about 400 nm, from about 10 nm to about 300 nm, from about 10 nm to about 200 nm, from about 10 nm to about 100 nm, from about 100 nm to about 1000 nm, from about 200 nm to about 1000 nm, from about 300 nm to about 1000 nm, from about 400 nm to about 1000 nm, from about 500 nm to about 1000 nm, from about 600 nm to about 1000 nm, from about 700 nm to about 1000 nm, from about 800 nm to about 1000 nm, or from about 900 nm to about 1000 nm. During the formation of the steps 245, the stack opening 235 may be further extended into the tiers 210 to form stack opening 235'. Depth D2 of the stack opening 235' may be greater than the depth D1 of the stack opening 235. The stack opening 235' is defined by sidewalls and a bottom surface of the tiers 210, with the steps 245 present along the sidewalls of the stack 205. The steps 245 are formed on opposing sidewalls of the stack 205 and are also referred to herein as opposing steps 245. The steps 245 may be formed as a pair of steps 245, with each step 245 of the pair of steps 245 positioned at substantially the same location on the opposing sidewalls of the stack 205. The sidewalls of the stack opening 235' above the steps 245 and below the steps 245 may be substantially vertical or may be sloped. Since the stepped profile in the sidewalls of the stack 205 is formed by laterally removing portions of the patterned resist 225 and transferring the pattern of the trimmed resist 240 to the underlying tiers 210, the stepped profile may be formed without increasing the cost or number of process acts conducted.

The one or more steps 245 are formed only in a portion of the tiers 210, with a remaining portion(s) of the tiers 210 including substantially vertical or sloped sidewalls. Therefore, the remaining portion(s) of the tiers 210 do not include (e.g., lack) steps 245. The tiers 210 may include substantially vertical or sloped sidewalls above and below the steps 245. Embodiments of the disclosure form the tiers 210 having the stepped profile (i.e., having one or more steps 245) in contrast to conventional methods where sidewalls of the tiers are substantially linear (see FIG. 1).

The steps 245 may be formed at a desired location by appropriately selecting the dimensions of the patterned resist 225, 225' and of the trimmed resist 240 and by adjusting the etch conditions, such as the etch time or etch temperature, of the tiers 210. By way of example only, increasing the etch time may remove additional exposed portion of the tiers 210, resulting in formation of the steps 245 at an increased depth along the sidewalls of the tiers 210. Conversely, decreasing the etch time may remove less of the exposed portions of the tiers 210, resulting in formation of the steps 245 at a decreased depth along the sidewalls of the tiers 210. The desired location of the steps 245 may be determined empirically, such as by observing where cracks form in the fill material when no step is present and subsequently forming the steps 245 proximal to the observed location where the cracks formed.

Figure 6A:
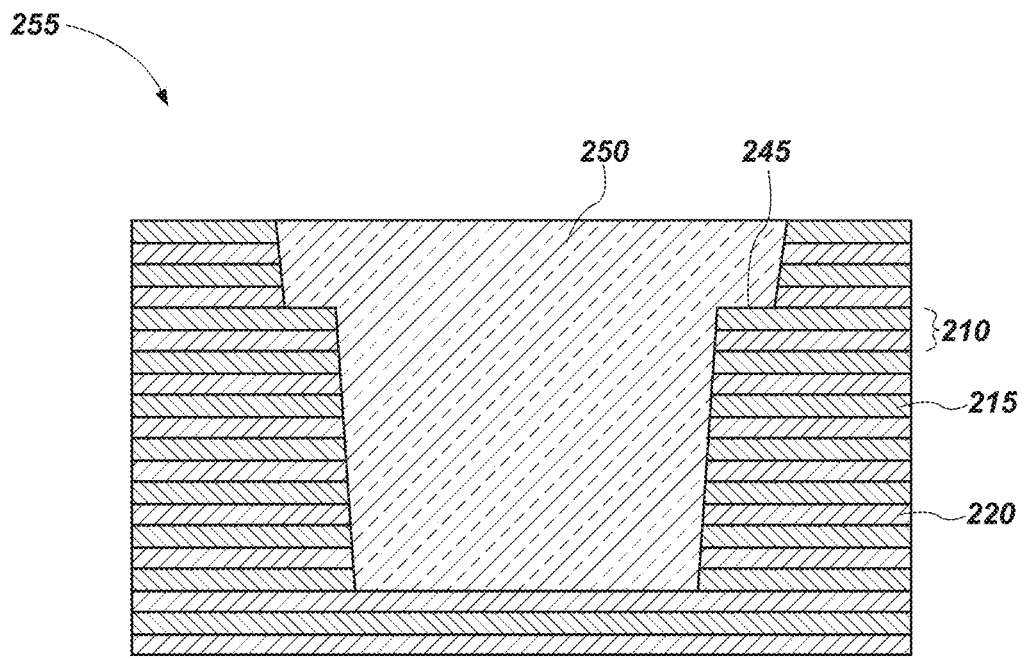

The trimmed resist 240 may be removed and a fill material 250 formed in the stack opening 235', as shown in FIG. 6A. The fill material 250 forms an indented portion proximal to the steps 245. The fill material 250 may be a material prone to cracking, such as when a large volume thereof is formed in the stack opening 235' having relatively large dimensions and when the fill material 250 is subsequently subjected to thermal treatment causing shrinkage induced stress. The large volume of the fill material 250 is believed to contribute to shrinkage and stress in the fill material 250. The fill material 250 may be a dielectric material, such as an oxide material, a nitride material, a spin-on dielectric material, or other dielectric material to be formed in the stack opening 235' having the relatively large dimensions. Alternatively, the fill material 250 may be a conductive material, such as a metal material. The fill material 250 may substantially completely fill the stack opening 235', with excess fill material (not shown) forming over the tiers 210 outside the stack opening 235'. The fill material 250 may be a single material (a material exhibiting a single chemical composition), in that no other material, such as a conductive material, is present in the stack opening 235'. The excess fill material may be removed by abrasive planarization (e.g., CMP) so that an upper surface of the stack 205 is substantially coplanar with an upper surface of the fill material 250, forming semiconductor structure 255. Although a large volume of the fill material 250 is used to substantially fill the stack opening 235' due to its large dimensions, the fill material 250 within the stack opening 235' may be substantially free of cracks and substantially free of delamination even after being subjected to stress from the thermal treatment and the abrasive planarization.

Without being bound by any theory, it is believed that the stepped profile of the stack 205 reduces or substantially eliminates mechanical stress (e.g., tensile stress, compressive stress) in the fill material 250 during the thermal treatment and abrasive planarization act. The reduced stress reduces or substantially eliminates the formation of cracks in the fill material 250, which reduces or substantially eliminates delamination of the fill material 250 from the sidewalls of the tiers 210. By way of example only, when the steps 245 are present in a top portion of the stack 205, as illustrated in FIG. 6A, the steps 245 may substantially prevent the formation of cracks in the fill material 250. Furthermore, even if cracks form, the cracks may not propagate through the fill material 250 due to the steps 245. It is believed that cracks, when present, start at a top surface of the fill material 250 at an interface between the fill material 250 and the sidewalls of the stack 205. Since a large volume of the fill material 250 is used to fill the stack opening 235', the stress builds up within the fill material 250. Without the step present, cracks 125 form and propagate into fill material 120 from the top surface due to stress buildup in the fill material 120, as shown in FIG. 1. However, when the steps 245 are present, as shown in FIG. 6A and subsequent drawings, cracks do not form in the fill material 250. Alternatively, any cracks that may form encounter the steps 245 and do not propagate further (e.g., below the steps 245). The formation of the steps 245 according to embodiments of the disclosure, therefore, also prevents cracks that may form from propagating, which reduces or substantially eliminates cracking and delamination of the fill material 250. Therefore, the occurrence of cracks and delamination is reduced or eliminated by the presence of the steps 245 along the sidewalls of the tiers 210. As the number of tiers 210 in semiconductor devices continues to increase, the extent to which cracking or delamination occurs may increase. However, with the steps 245, cracks or delamination in the semiconductor devices will be reduced or substantially eliminated. Therefore, the semiconductor structure 255 including the step(s) 245 formed according to embodiments of the disclosure may be substantially free of cracks and delamination.

Figure 6B:
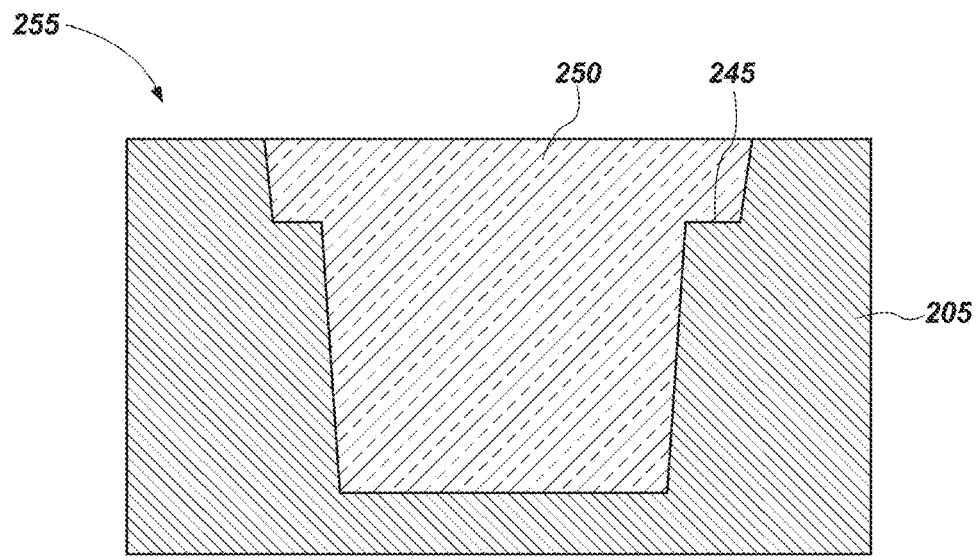
Figure 7A:
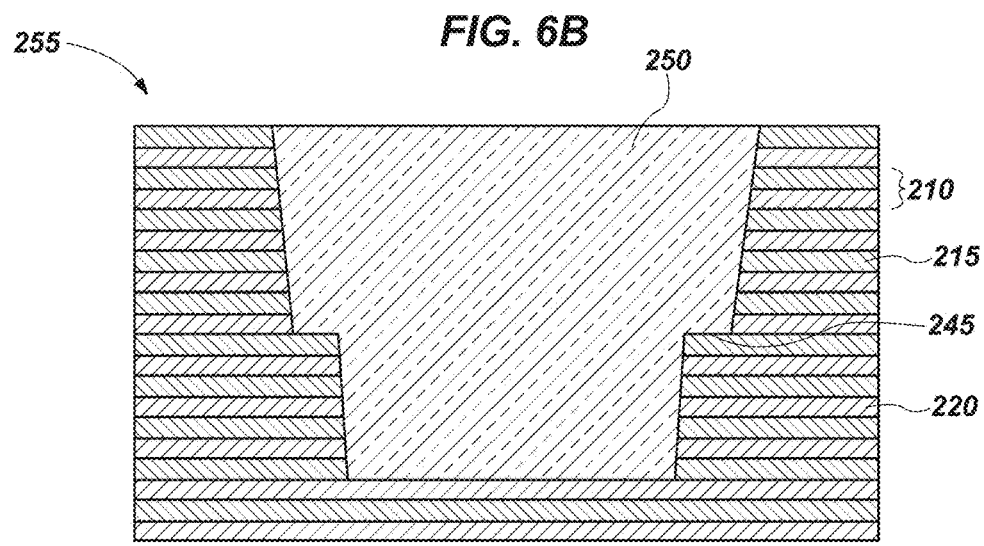
FIGS. 7A-12B are cross-sectional views of additional semiconductor structures in accordance with embodiments of the disclosure.
Figure 7B:
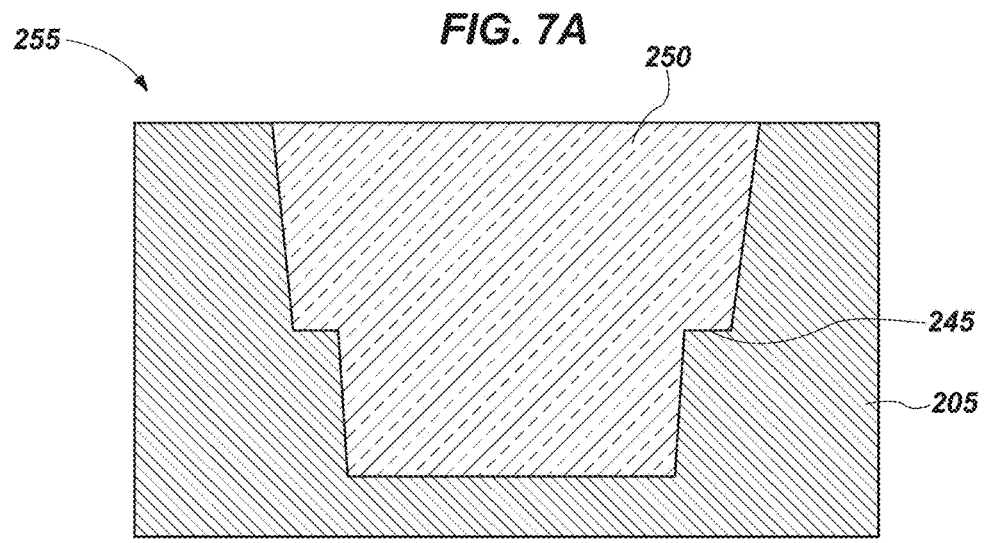
Figure 8A:
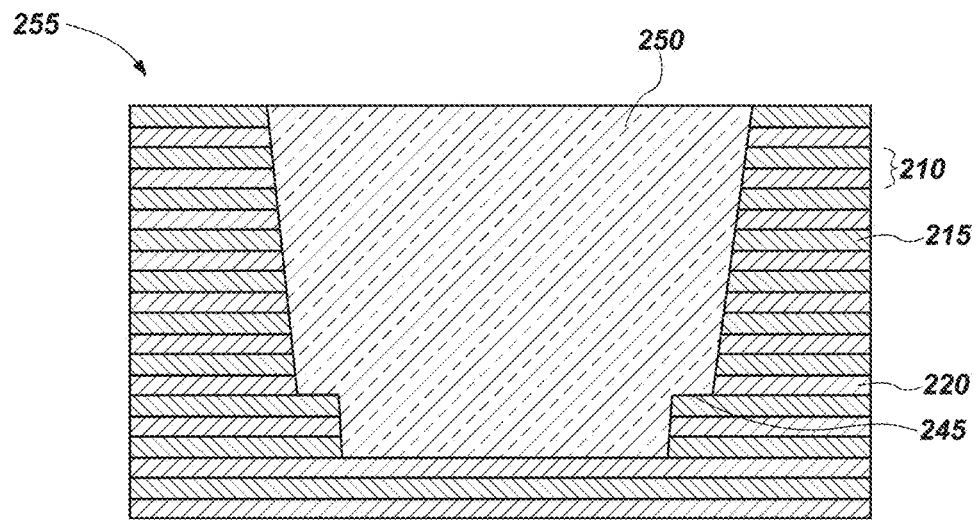
Figure 8B:
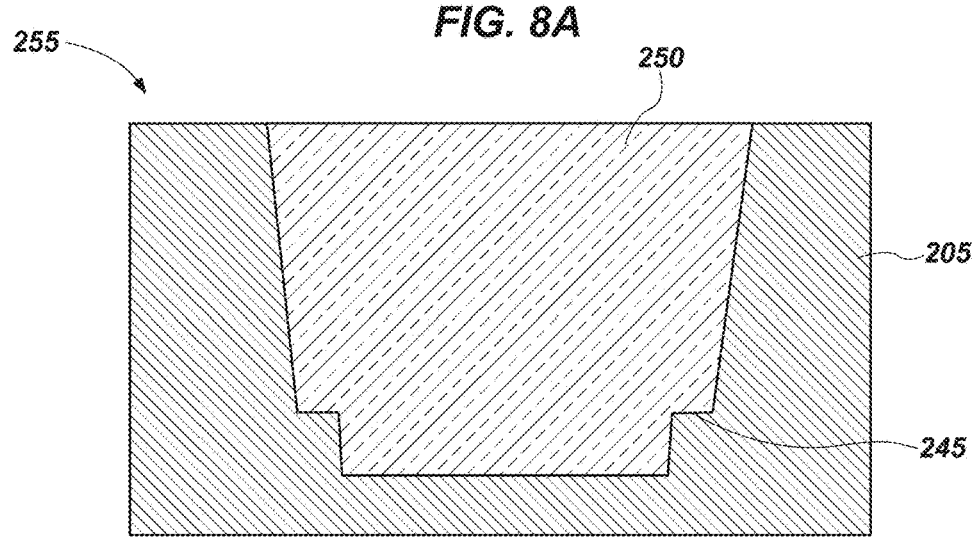

While FIG. 6A illustrates the semiconductor structure 255 as including the steps 245 in the stack 205 containing alternating, first and second materials 215, 220, the stack 205 may be formed of a single material and the steps 245 may be formed in the single material, as shown in FIG. 6B. The steps 245 may also be located at a different portion of the stack 205, such as at a middle portion or a bottom portion, as shown in FIGS. 7A and 8A, respectively. The steps 245 may be formed in the alternating, first and second materials 215, 220, as shown in FIGS. 7A and 8A, or in a single material, as shown in FIGS. 7B and 8B. The steps 245 may be formed at the different location by modifying the dimensions of the patterned resist 225, the patterned resist 225', and the trimmed resist 240 and by modifying the depths D1, D2 at which the stack openings 235, 235' are formed. In addition, smaller steps 245 having, for example, a smaller riser portion, a smaller tread portion, or a combination thereof, or larger steps 245 having, for example, a larger riser portion, a larger tread portion, or a combination thereof, than the steps 245 illustrated in FIG. 6 may be formed by modifying the etch conditions, such as the etch time or etch temperature. Therefore, the steps 245 in the tiers 210 may be formed at a desired location and at a desired size.

Accordingly, a method of forming a semiconductor device is disclosed. The method comprises forming a patterned resist over a stack comprising at least one material. A portion of the stack exposed through the patterned resist is removed to form a stack opening. A portion of the patterned resist is laterally removed to form a trimmed resist. An additional portion of the stack exposed through the trimmed resist is removed to form steps in sidewalls of the stack. A dielectric material is formed in the stack opening to substantially completely fill the stack opening, and the fill material is planarized.

The stepped profile of the semiconductor structure 255 may also include more than one step 245 in each of the sidewalls of one or more of the top portion, the middle portion, or the bottom portion of the stack 205, as shown in FIGS. 9A-12B. However, every tier 210 of the tiers 210 does not include a step 245, and the steps 245 do not extend substantially continuously from the top surface of the tiers 210 to the bottom surface of the tiers 210. The additional step(s) 245 may be formed by removing (e.g., etching) an additional portion of the trimmed resist 240 (see FIG. 5) from horizontal surfaces and vertical surfaces of the trimmed resist 240 to form a further trimmed resist (not shown) and using the further trimmed resist as a mask to remove (e.g., etch) exposed portions of the tiers 210. The trimming act and the act of using the trimmed resist as a mask may be conducted multiple times (e.g., repeatedly) to form the desired number of steps 245 in the sidewalls of the stack 205. Each opposing step 245 may be formed by a separate sequence of trimming the resist and etching the exposed portion of the tiers 210. Each of the steps 245 is defined by a respective riser portion and a respective tread portion of the sidewalls of the tiers 210, with the tread portions extending in a substantially horizontal direction and the riser portions extending in a substantially vertical or sloped direction.

Figure 9A:
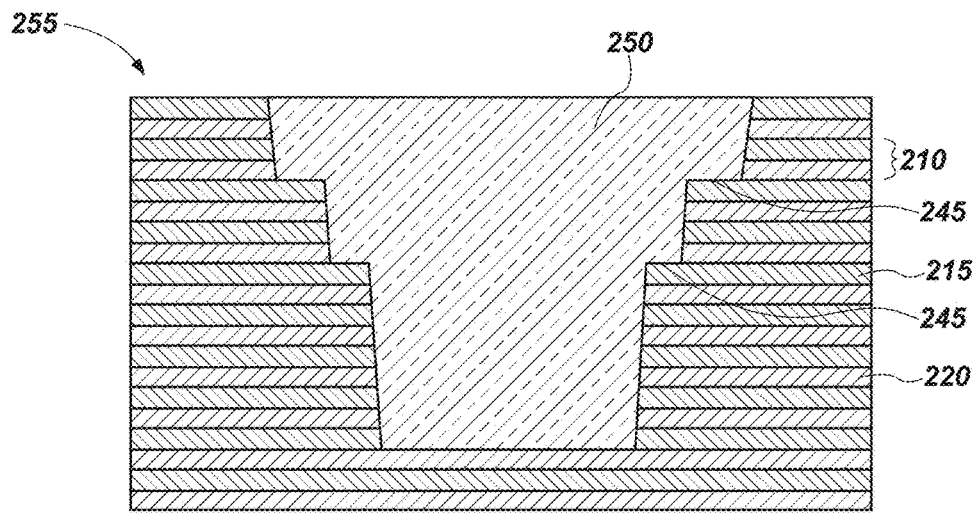
Figure 9B:
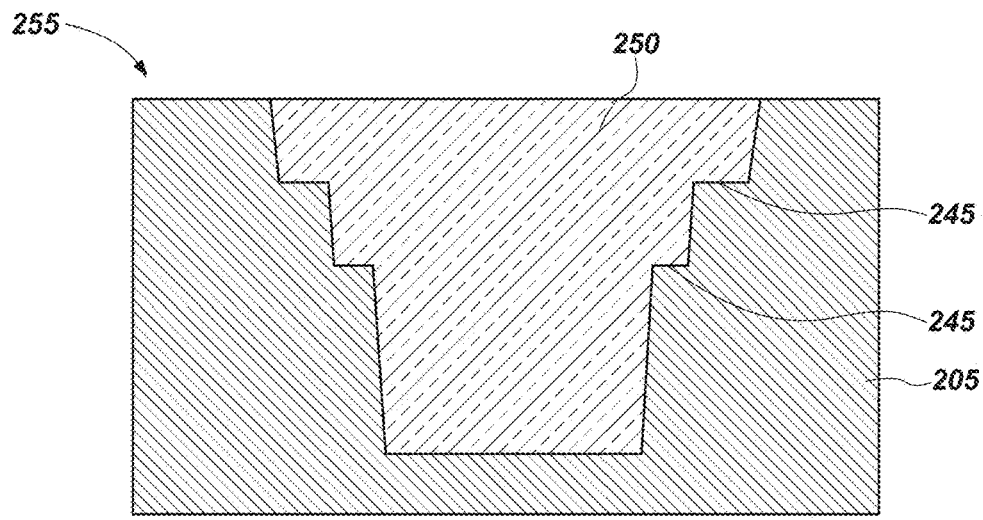
Figure 10A:
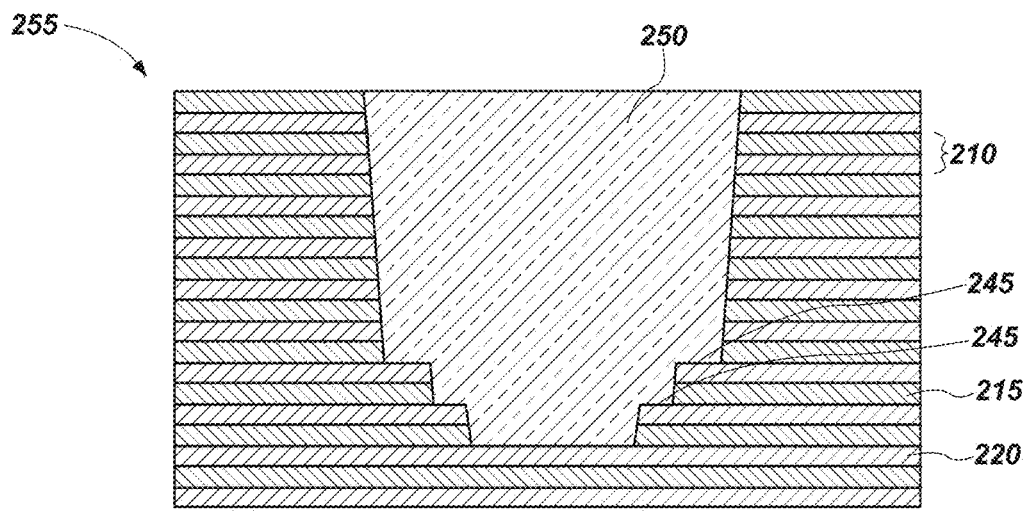
Figure 10B:
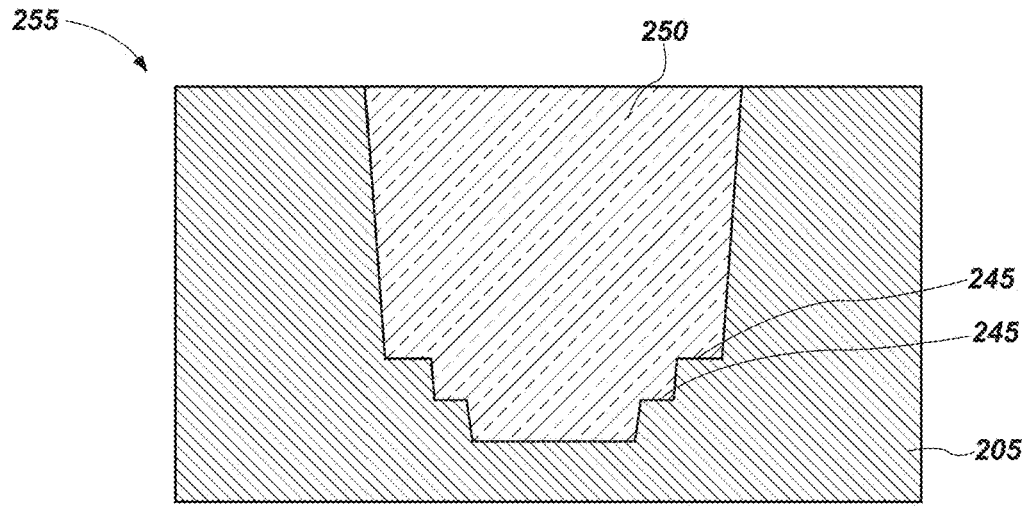
Figure 11A:
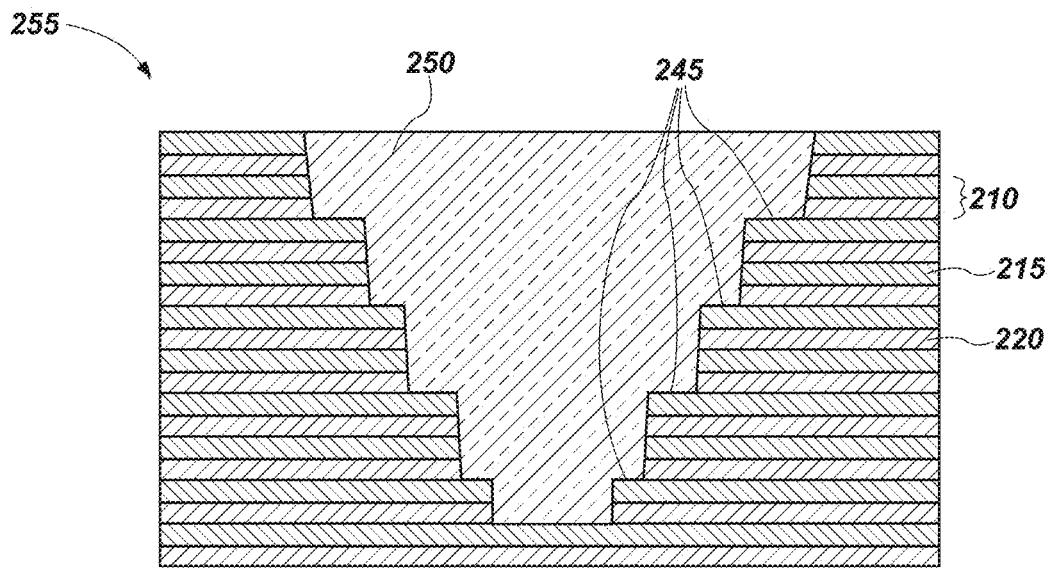
Figure 11B:
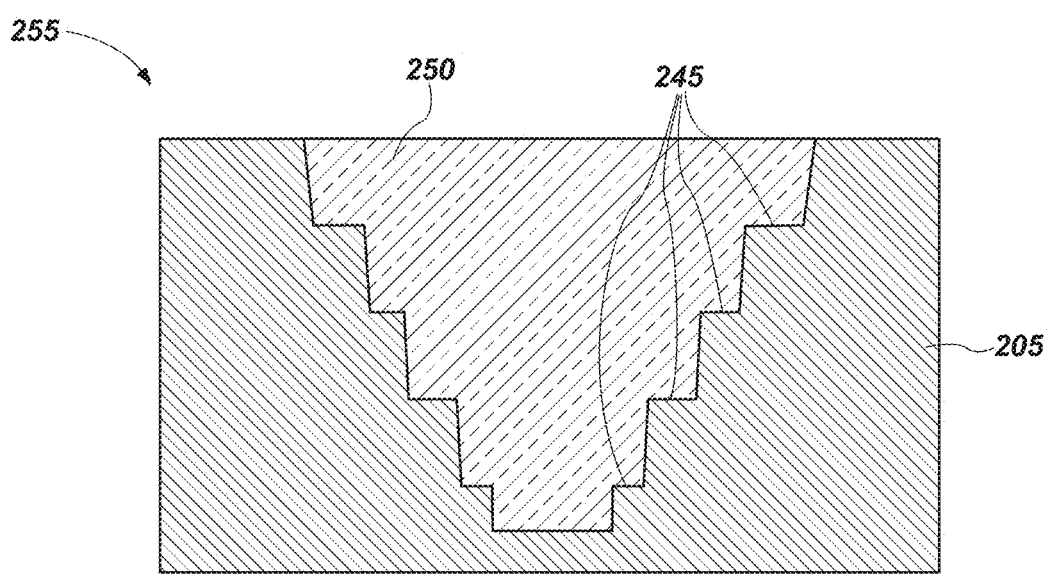
Figure 12A:
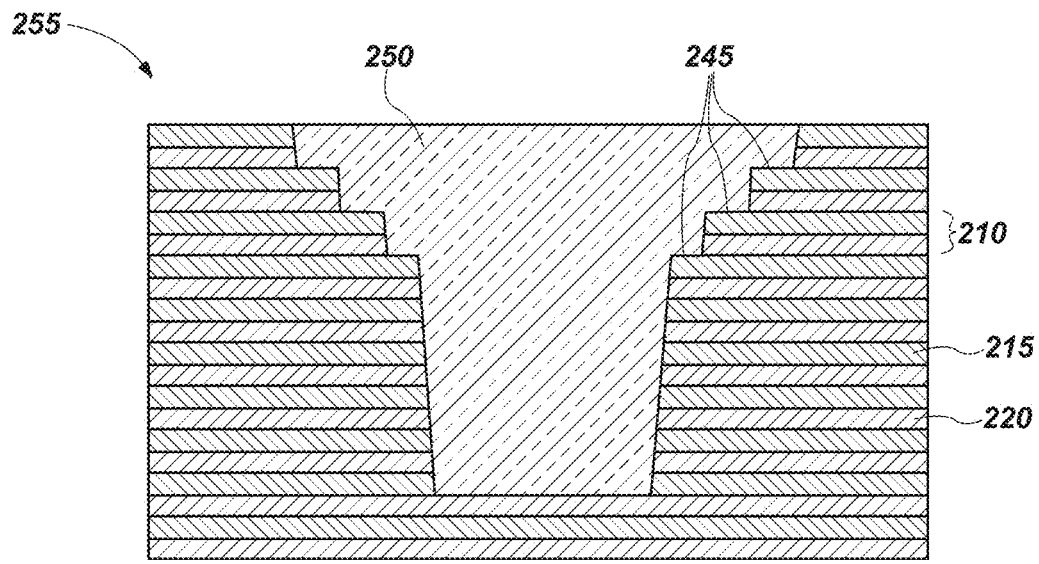
Figure 12B:
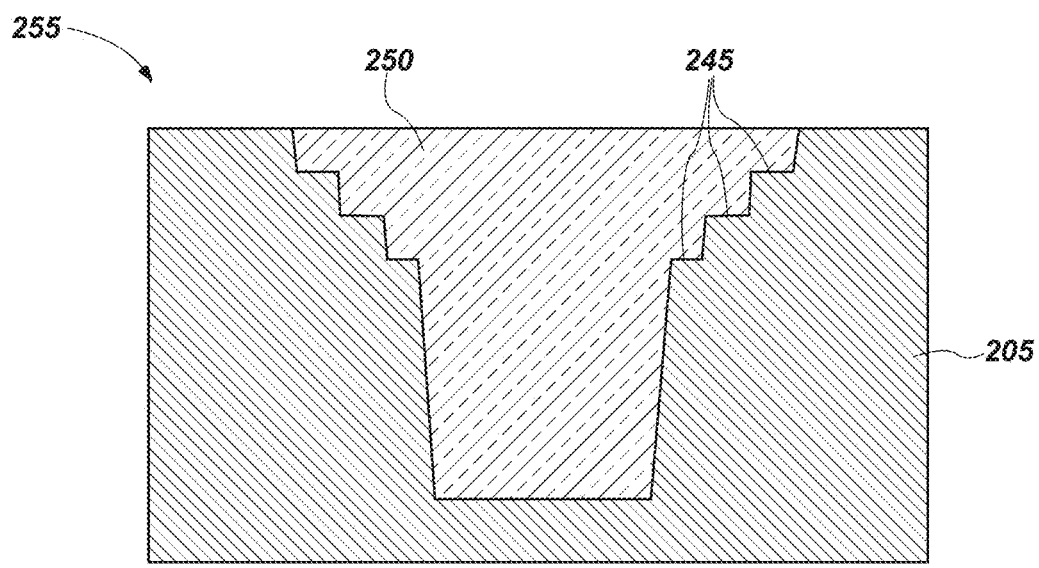

The steps 245 may be located at various portions of the stack 205, such as at the top portion, the middle portion, the bottom portion, or a combination thereof. However, the steps 245 do not extend substantially continuously from the top surface of the tiers 210 to the bottom surface of the tiers 210. The steps 245 may include multiple small (e.g., shallow) steps 245 in one or more of the top portion, the middle portion, or the bottom portion of the stack 205. Alternatively, multiple large (e.g., deep) steps 245 may be formed along the sidewalls of the stack 205 in one or more of the top portion, the middle portion, or the bottom portion of the stack 205. The small steps 245 or large steps 245 may be evenly spaced along the sidewalls of the stack 205, or the small steps 245 or large steps 245 may be unevenly spaced along the sidewalls of the stack 205. As shown in FIG. 9A, two large steps 245 may be present in opposing sidewalls of the alternating, first and second materials 215, 220, one large step 245 in each sidewall at the top portion and the other large step 245 in each sidewall at the middle portion of the stack 205. The large steps 245 may alternatively be present in a single material of the stack 205, as shown in FIG. 9B. Therefore, a total of four large steps 245 may be present, two large steps 245 on each opposing sidewall. As shown in FIG. 10A, two small steps 245 may be present in opposing sidewalls of the bottom portion of the stack 205 including the alternating, first and second materials 215, 220 while FIG. 10B shows the two small steps 245 present in opposing sidewalls of a single material of the stack 205. Therefore, a total of four small steps 245 may be present, two small steps 245 on each opposing sidewall. As shown in FIG. 11A, four steps 245 of different sizes may be present in the opposing sidewalls of the top portion, the middle portion, and the bottom portion of the stack 205 including alternating, first and second materials 215, 220. FIG. 11B shows the four steps 245 present in opposing sidewalls of a single material of the stack 205. Therefore, a total of eight steps 245 may be present, four steps 245 in each opposing sidewall. As shown in FIG. 12A, three shallow steps 245 may be present in the opposing sidewalls of the top portion of the stack 205 while FIG. 12B shows the three shallow steps 245 present in the opposing sidewalls of a single material of the stack 205. Therefore, a total of six shallow steps 245 may be present, three shallow steps 245 on each opposing sidewall. The number and location of steps 245 in the stack 205 is not limited to the embodiments illustrated in FIGS. 9A-12B. Additional embodiments including more than four steps 245 are contemplated, as are embodiments including various combinations of small steps 245 and large steps 245. However, and as previously described, the steps 245 are not present in every tier 210 and do not extend in a continuous manner from the top surface to the bottom surface of the stack 205.

Accordingly, a method of forming a semiconductor device is disclosed. The method comprises forming a patterned resist over a stack comprising alternating materials, forming a stack opening in the stack, and removing a portion of the patterned resist to form a trimmed resist. A portion of the stack exposed through the trimmed resist is removed to form opposing steps in sidewalls of the stack and to increase horizontal and vertical dimensions of the stack opening. Additional portions of the trimmed resist and the stack are removed to form additional opposing steps in the sidewalls of the stack. A fill material is formed in the stack opening to substantially completely fill the stack opening, and the fill material is subjected to abrasive planarization.

After planarizing the fill material 250 of the semiconductor structure 255, additional process acts are conducted to form features, such as semiconductor features, above or adjacent to the step(s) 245. The features may include, but are not limited to, transistors, capacitors, resistors, contacts, alignment marks, etc., depending on the semiconductor device to be formed. The features may be formed by conventional processes, which are not described in detail herein. The semiconductor structure 255 including the step(s) 245 may, for example, be used in a semiconductor device, such as a three-dimensional (3D) semiconductor device. The 3D semiconductor device may include, but is not limited to, a 3D NAND Flash memory device, such as a 3D floating gate NAND Flash memory device or a 3D replacement gate NAND Flash memory device. The 3D semiconductor device may, for example, include a staircase structure. The 3D semiconductor device may also be a DRAM device or other semiconductor device in which a large volume of fill material is formed in an opening of large dimensions and in which the one or more steps 245 would reduce or eliminate cracks in the fill material. Additional process acts may be conducted to form the semiconductor device (e.g., the 3D NAND Flash memory device) including the semiconductor structure 255. The additional process acts for fabricating the semiconductor device may be conducted by conventional techniques, which are not described in detail herein.

Figure 13:
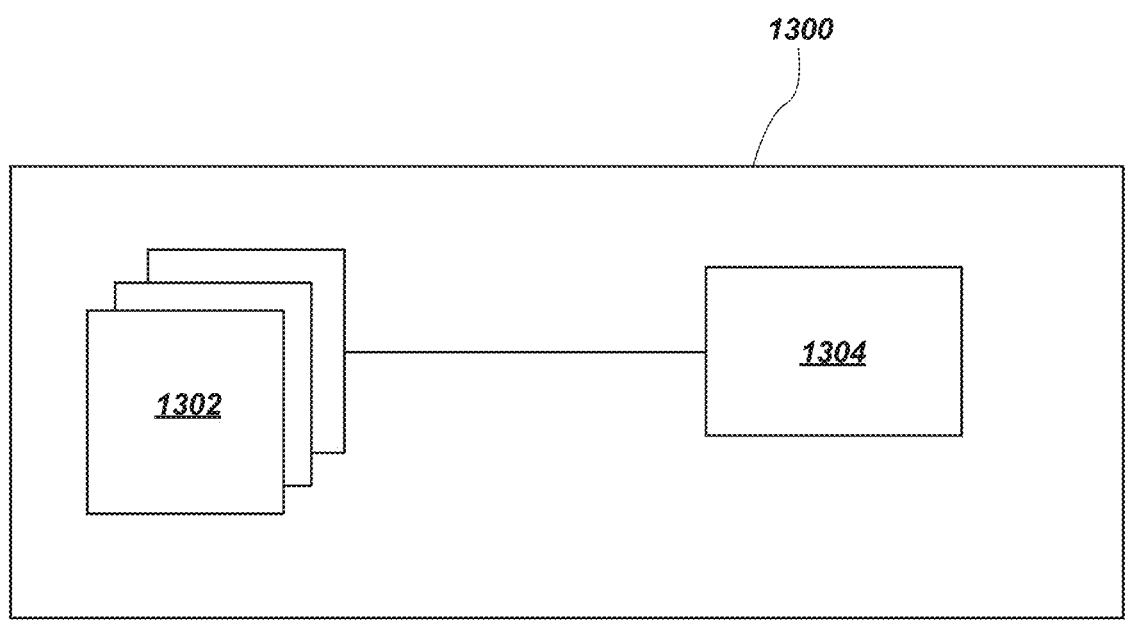
FIG. 13 is a schematic block diagram illustrating a semiconductor device including semiconductor structures in accordance with embodiments of the disclosure.

A semiconductor device, such as a memory device 1300, is also disclosed, as shown schematically in FIG. 13. The memory device 1300 includes a memory array 1302 of memory cells including at least one semiconductor structure 255 according to embodiments of the disclosure and a control logic component 1304. The control logic component 1304 may be configured to operatively interact with the memory array 1302 so as to read, write, or re-fresh any or all memory cells within the memory array 1302. The memory device 1300 includes the memory array 1302 formed over and electrically coupled to a source. The memory cells are coupled to access lines (e.g., word lines), and the access lines are coupled to control gates of the memory cells.

Figure 14:
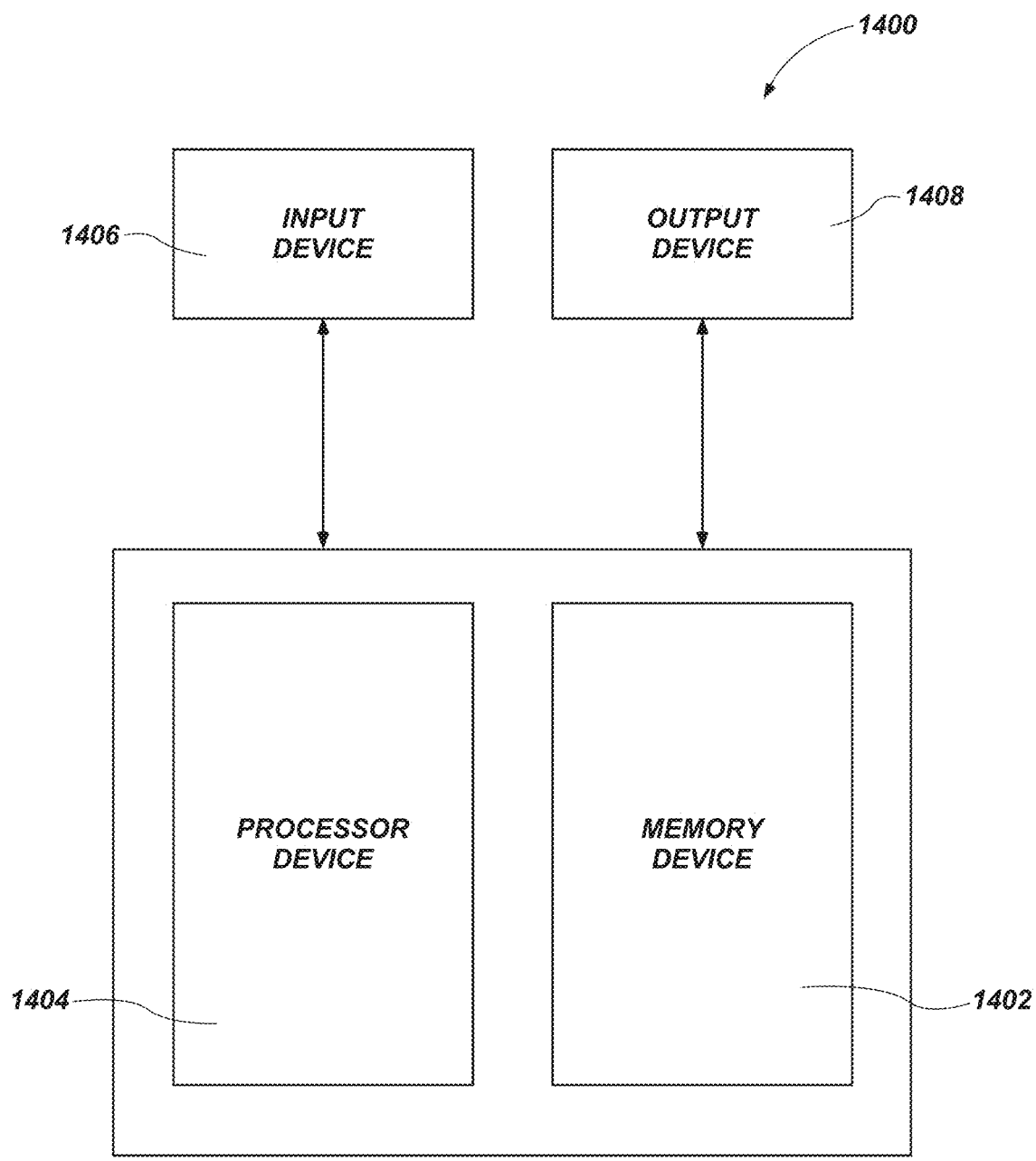
FIG. 14 is a schematic block diagram illustrating a system including a semiconductor device in accordance with embodiments of the disclosure.

A system 1400 is also disclosed, as shown in FIG. 14 and includes at least one semiconductor structure 255 according to embodiments of the disclosure. FIG. 14 is a simplified block diagram of the system 1400 implemented according to one or more embodiments described herein. The system 1400 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an IPAD® or SURFACE® tablet, an electronic book, a navigation device, etc. The system 1400 includes at least one memory device 1402, which includes memory cells including the semiconductor structure 255 as previously described. The system 1400 may further include at least one processor device 1404 (often referred to as a "processor"). The processor device 1404 may, optionally, include at least one semiconductor structure 255 as previously described. The system 1400 may further include one or more input devices 1406 for inputting information into the electronic system 1400 by a user, such as, for example, a mouse or other pointing device, a keyboard, a touchpad, a button, or a control panel. The electronic system 1400 may further include one or more output devices 1408 for outputting information (e.g., visual or audio output) to a user such as, for example, a monitor, a display, a printer, an audio output jack, a speaker, etc. In some embodiments, the input device 1406 and the output device 1408 may comprise a single touchscreen device that can be used both to input information to the electronic system 1400 and to output visual information to a user. The one or more input devices 1406 and output devices 1408 may communicate electrically with at least one of the memory device 1402 and the processor device 1404. The at least one memory device 1402 and processor device 1404 may also be used in a system on chip (SoC).

Accordingly, a semiconductor device is disclosed and comprises a stack of materials comprising opposing steps in a portion of the stack, the opposing steps defined by opposing sidewalls of the stack of materials. A dielectric material is between the opposing sidewalls of the stack of materials and at least one semiconductor feature is adjacent the stack of materials.

Accordingly, a semiconductor device is disclosed and comprises opposing steps in a portion of a stack material. A fill material comprising a single material is adjacent the opposing steps of the stack material and at least one semiconductor feature is adjacent the stack material.

The following examples serve to explain embodiments of the disclosure in more detail. These examples are not to be construed as being exhaustive or exclusive as to the scope of this disclosure.

EXAMPLES

Example 1

A stack opening was formed in a stack containing 74 tiers of alternating polysilicon materials and silicon dioxide materials. The stack opening was formed in accordance with an embodiment of the disclosure. A step was formed in a top portion of the sidewalls of the tiers (similar to that illustrated in FIG. 6) in accordance with an embodiment of the disclosure. The stack opening was filled with an oxide material and subjected to CMP. No cracks were formed in the fill material following the CMP and no delamination was observed.

Example 2 (Comparative Example)

As a control, a stack opening was formed in a stack containing 74 tiers of alternating polysilicon materials and silicon dioxide materials. The stack included the same number of tiers and the same materials as in Example 1. The stack opening was formed as described in Example 1 and with the same dimensions. The stack opening was filled with the same fill material as in Example 1 and subjected to CMP using the same conditions as in Example 1. Cracks formed in the fill material during the CMP.

Example 3

A stack opening is formed in a stack containing 106 tiers of alternating polysilicon materials and silicon dioxide materials. The stack opening is formed in accordance with an embodiment of the disclosure. A step is formed in a top portion of the sidewalls of the tiers (similar to that illustrated in FIG. 6) in accordance with an embodiment of the disclosure. The stack opening is filled with an oxide material and subjected to CMP. No cracks are formed in the fill material following the CMP and no delamination is observed.

Example 4 (Comparative Example)

As a control, a stack opening is formed in a stack containing 106 tiers of alternating polysilicon materials and silicon dioxide materials. The stack includes the same number of tiers and tier materials as in Example 3. The stack opening is formed as described in Example 3 and with the same dimensions. The stack opening is filled with the same fill material as in Example 3 and subjected to CMP using the same conditions as in Example 3. Cracks formed in the fill material during the CMP.

Based on the results of Examples 1-4, the step in the tiers is found to substantially eliminate cracking in and delamination of the fill material.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor device, comprising:
a staircase structure comprising steps in a stack of materials comprising alternating conductive materials and dielectric materials, opposing sidewalls of the staircase structure defining the steps extending an entire distance of the stack; and
additional steps of the staircase structure, the additional steps distinct from the steps of the staircase structure and extending partially the distance of the stack.

2. The semiconductor device of claim 1, wherein the steps extend an entire depth of the stack of materials.

3. The semiconductor device of claim 1, wherein the steps extend substantially continuously along the stack of materials and the additional steps extend along only a portion of the stack of materials.

4. The semiconductor device of claim 1, wherein one or more of the additional steps comprises a different size than other of the one or more additional steps.

5. The semiconductor device of claim 1, wherein the additional steps do not extend substantially continuously along the stack of materials.

6. A semiconductor device, comprising:
a staircase structure comprising steps in a stack of materials, the stack of materials comprising tiers of alternating conductive materials and dielectric materials, the steps extending substantially continuously from a top surface of the stack of materials to a bottom surface of the stack of materials;
one or more additional steps on opposing sidewalls and in a different portion of the stack of materials than the steps, the one or more additional steps distinct from the steps of the staircase structure and extending a portion of a distance between the top surface of the stack of materials and the bottom surface of the stack of materials; and
a fill material between the opposing sidewalls of the one or more additional steps.

7. The semiconductor device of claim 6, wherein the one or more additional steps are not present in each tier of the tiers of alternating conductive materials and dielectric materials.

8. The semiconductor device of claim 6, wherein the one or more additional steps comprise a single step in an upper portion of the stack of materials.

9. The semiconductor device of claim 6, wherein the one or more additional steps comprise a single step in a middle portion of the stack of materials.

10. The semiconductor device of claim 6, wherein the one or more additional steps comprise multiple steps in an upper portion of the stack of materials.

11. The semiconductor device of claim 6, wherein the one or more additional steps comprise multiple steps in a middle portion of the stack of materials.

12. A semiconductor device, comprising:
a staircase structure comprising steps in a stack of one or more materials, the steps extending a depth of the stack;
additional opposing steps in a different portion of the staircase structure than the steps, the additional opposing steps distinct from the steps and extending only a portion of the depth of the staircase structure; and
a fill material between opposing sidewalls of the additional opposing steps.

13. The semiconductor device of claim 12, wherein the stack of one or more materials comprises a single material.

14. The semiconductor device of claim 12, wherein the stack of one or more materials comprises conductive materials and dielectric materials.

15. The semiconductor device of claim 12, wherein the fill material comprises a conductive material.

16. The semiconductor device of claim 12, wherein the fill material comprises an oxide material, a nitride material, or a spin-on material.

17. The semiconductor device of claim 12, wherein sidewalls of the stack of one or more materials exhibit a stepped profile.

18. The semiconductor device of claim 12, wherein the steps extend substantially continuously along the stack of one or more materials and the additional opposing steps extend along only an upper portion of the stack.

19. The semiconductor device of claim 12, wherein the steps extend substantially continuously along the stack of one or more materials and the additional opposing steps extend along only a middle portion of the stack.

20. The semiconductor device of claim 12, wherein the steps extend substantially continuously along the stack of one or more materials and the additional opposing steps extend along only a lower portion of the stack.

* * * * *